(12) United States Patent
Gill et al.

(10) Patent No.: US 10,222,742 B2
(45) Date of Patent: Mar. 5, 2019

(54) SYSTEMS AND METHODS FOR IMPROVING RESOLUTION IN LENSLESS IMAGING

(71) Applicant: Rambus Inc., Sunnyvale, CA (US)

(72) Inventors: Patrick R. Gill, Sunnyvale, CA (US); David G. Stork, Portola Valley, CA (US); Mehjabin Sultana Monjur, Evanston, IL (US); Luke A. Pfister, Urbana, IL (US)

(73) Assignee: Rambus Inc., Sunnyvale, CA (US)

( * ) Notice: Subject to any disclaimer, the term of this patent is extended or adjusted under 35 U.S.C. 154(b) by 108 days.

(21) Appl. No.: 15/458,871

(22) Filed: Mar. 14, 2017

(65) Prior Publication Data

US 2017/0300011 A1    Oct. 19, 2017

Related U.S. Application Data

(60) Provisional application No. 62/322,385, filed on Apr. 14, 2016.

(51) Int. Cl.
| | |
|---|---|
| G02B 5/18 | (2006.01) |
| G03H 1/04 | (2006.01) |
| H01L 27/146 | (2006.01) |
| H04N 5/225 | (2006.01) |
| G03H 1/02 | (2006.01) |

(52) U.S. Cl.
CPC ........... *G03H 1/041* (2013.01); *G02B 5/1871* (2013.01); *G03H 1/0443* (2013.01); *H01L 27/14625* (2013.01); *H04N 5/2251* (2013.01); *G03H 1/0244* (2013.01); *G03H 2223/13* (2013.01)

(58) Field of Classification Search
CPC .............. G02B 5/18; G02B 2005/1804; G02B 5/1809; G02B 5/1814; G02B 5/1842; G02B 5/1866; G02B 5/1871; G02B 5/28; G02B 5/281; G02B 5/285
USPC ....... 359/558, 566, 569, 573, 575, 576, 577, 359/580, 586, 587
See application file for complete search history.

(56) References Cited

U.S. PATENT DOCUMENTS

| | | | | |
|---|---|---|---|---|
| 5,274,720 A | * | 12/1993 | Yamamoto | G02B 6/10 359/569 |
| 6,822,794 B2 | * | 11/2004 | Coleman | G02B 5/1814 359/15 |

(Continued)

OTHER PUBLICATIONS

Suleski, Thomas J., "Generation of Lohmann images from Binary-Phase Talbot Array Illuminators", Applied Optics, vol. 36, No. 20, pp. 4686-4691, Jul. 10, 1997. 6 pages.

*Primary Examiner* — Arnel C Lavarias
(74) *Attorney, Agent, or Firm* — Silicon Edge Law Group LLP; Arthur J. Behiel

(57) ABSTRACT

An optical phase grating produces an interference pattern rich in intensity and spatial-frequency information from the external scene. The grating includes an odd number of repeated sets of adjacent horizontal portions, separated by steps, that fill an area that radiates outward from a central region. At a given distance from the central region and within the area of the phase grating, each of the first horizontal portions is of a first width that differs from a second width of the adjacent second horizontal portions. The interference patterns produced by the grating can be processed to extract images and other information of interest about an imaged scene.

14 Claims, 8 Drawing Sheets

(56) References Cited

U.S. PATENT DOCUMENTS

| | | | |
|---|---|---|---|
| 6,856,460 B2* | 2/2005 | Coleman | G02B 5/1814 359/15 |
| 2015/0277014 A1 | 10/2015 | Schrader | |
| 2018/0091705 A1* | 3/2018 | Gill | G02B 5/1842 |
| 2018/0197909 A1* | 7/2018 | Gill | H01L 27/14623 |
| 2018/0275323 A1* | 9/2018 | Schneider | G02B 5/1842 |

* cited by examiner

SYSTEMS AND METHODS FOR IMPROVING RESOLUTION IN LENSLESS IMAGING

BACKGROUND

A new type of image sensor integrates an optical phase grating with a photodetector array. The phase grating produces an interference pattern that is unintelligible to a human observer, but that nevertheless includes intensity and spatial-frequency information that can be processed to recover an image or other information of interest in the imaged scene. For example, U.S. Patent Publication 2015/0061065 to Patrick R. Gill and David G. Stork, incorporated herein, describes image sensors with phase anti-symmetric gratings that, with processing, can acquire images and image data without a lens.

Eliminating the requirement for a lens can greatly reduce the size and cost of image sensors. These savings are of particular interest in infrared (IR) imaging systems because the materials used in the manufacture of IR lenses (e.g., monocrystalline Germanium) are generally expensive relative to those for visible light, and the cost of IR lenses tends to scale with the cube of their linear size.

BRIEF DESCRIPTION OF THE DRAWINGS

The detailed description is illustrated by way of example, and not by way of limitation, in the figures of the accompanying drawings and in which like reference numerals refer to similar elements and in which:

FIG. 4A is a plan view of a phase grating 400 similar to phase grating 100 of FIG. 1A, with like-identified elements being the same or similar.

FIG. 5A is a plan view of a phase grating 500 similar to phase grating 100 of FIG. 1A, with like-identified elements being the same or similar.

DETAILED DESCRIPTION

Figure 1A:
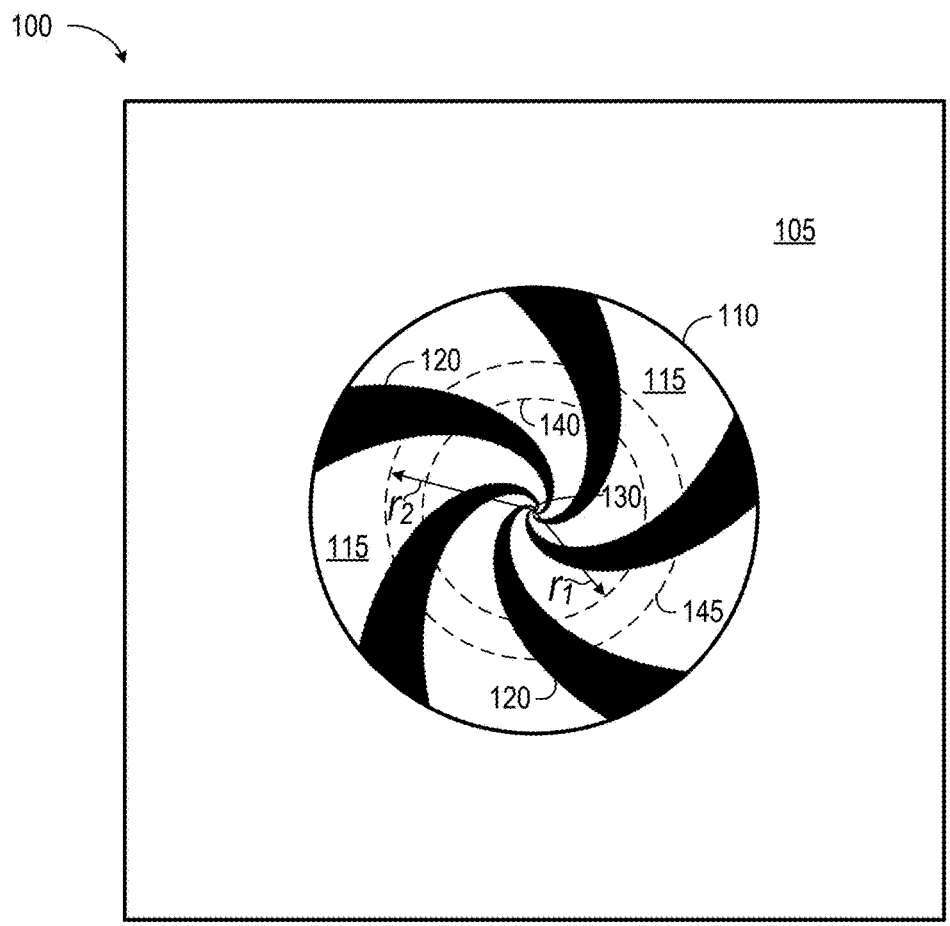
FIG. 1A is a plan view of an optical phase grating 100 that can, responsive to incident light from a scene of interest, produce an interference pattern rich in intensity and spatial-frequency information.

FIG. 1A is a plan view of an optical phase grating 100 that can, responsive to incident light from a scene of interest, produce an interference pattern rich in intensity and spatial-frequency information. Such interference patterns can be sampled and processed to extract images and other information of interest about the imaged scene. For a given image resolution, phase grating 100 enables the construction of imaging devices much smaller than possible using the optical paths of traditional cameras, and at a much lower cost.

An opaque layer 105 defines an aperture 110 to admit light. The grating structure includes an odd number of repeated sets of first horizontal portions 115 (white) and second horizontal portions 120 (black) that fill an area within aperture 110 that radiates outward from a central region 130 of grating 100. In some embodiments, the central region 130 consists of a point and both the first horizontal portions 115 and second horizontal portions 120 begin radiating at the point. In other embodiments, the central region 130 comprises an area and the first horizontal portions 115 begin radiating at a different location within the area of the central region 130 than the second horizontal portions 120. Horizontal portions 115 and 120 are perpendicularly offset from one another, portions 115 being raised with respect to portions 120 from a perspective normal to the page.

Horizontal portions 115 and 120 are all of the same material, which is selected to pass light of a wavelength band of interest for imaging tasks (e.g., visible or IR light). Two radii $r_1$ and $r_2$ represent distances from central region 130 that lie within the effective area of phase grating 100, and that define respective circles 140 and 145. Along these radii, each of first horizontal portions 115 is twice as wide as the adjacent second horizontal portions 120. Within a given ellipse centered on grating 100, the collective area of horizontal portions 115 is twice that of portions 120.

Figure 1B:
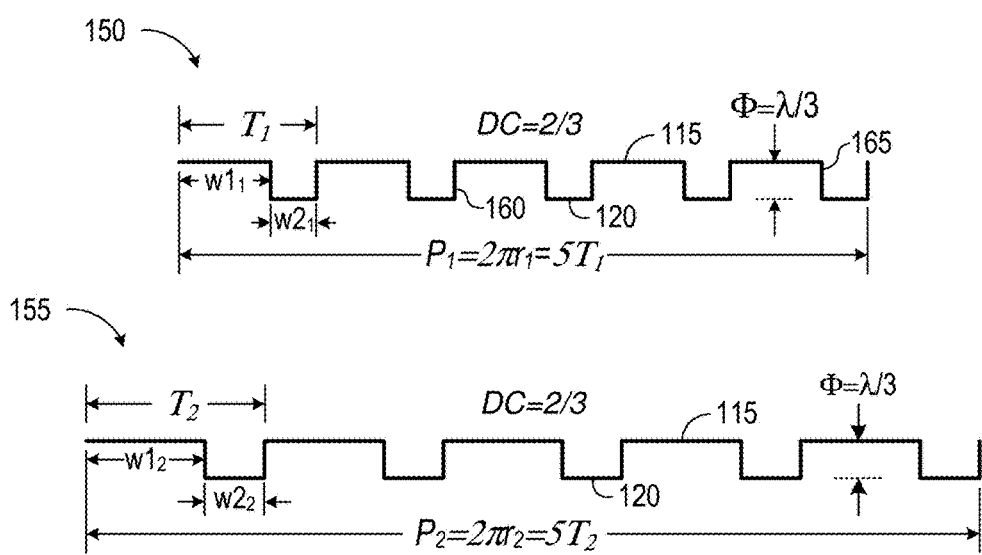
FIG. 1B depicts a pair of "unrolled" elliptical sections 150 and 155 that represent the topography of grating 100 along circles 140 and 145 of FIG. 1A.

FIG. 1B depicts a pair of "unrolled" elliptical sections 150 and 155 that represent the topography of grating 100 along circles 140 and 145 of FIG. 1A. Being a circle that extends through five pairs of offset horizontal portions 115 and 120, section 150 extends along a periphery $P_1$ of distance $2\pi r_1$ and exhibits five periods $T_1$. Horizontal portions 120 are of a width $w1_1$ that is twice the width $w2_1$ of portions 125, so section 150 has a duty cycle of two-thirds. In this embodiment, rising and falling steps 160 and 165 between adjacent horizontal portions 115 and 120 are of a height Φ that is one-third of a wavelength λ that lies within the wavelength band of interest (e.g., 500 nm for visible light, or 1,000 nm for near infrared). Section 155 is similar to section 150, with the same duty cycle, but the periphery $P_2$, period $T_2$, and constituent widths $w1_2$ and $w2_2$ are increased in proportion to radius $r_2$.

Peripheries $P_1$ and $P_2$ of sections 150 and 155 each extend along an odd number of periods. In general, a periphery P of an elliptical section centered on grating 100 is equal to the period T multiplied by 2n−1, where n is a positive integer.

Sections 150 and 155 can extend along an even number of periods in other embodiments, but the resultant symmetry increases orientation redundancy by a factor of two.

Figure 2:
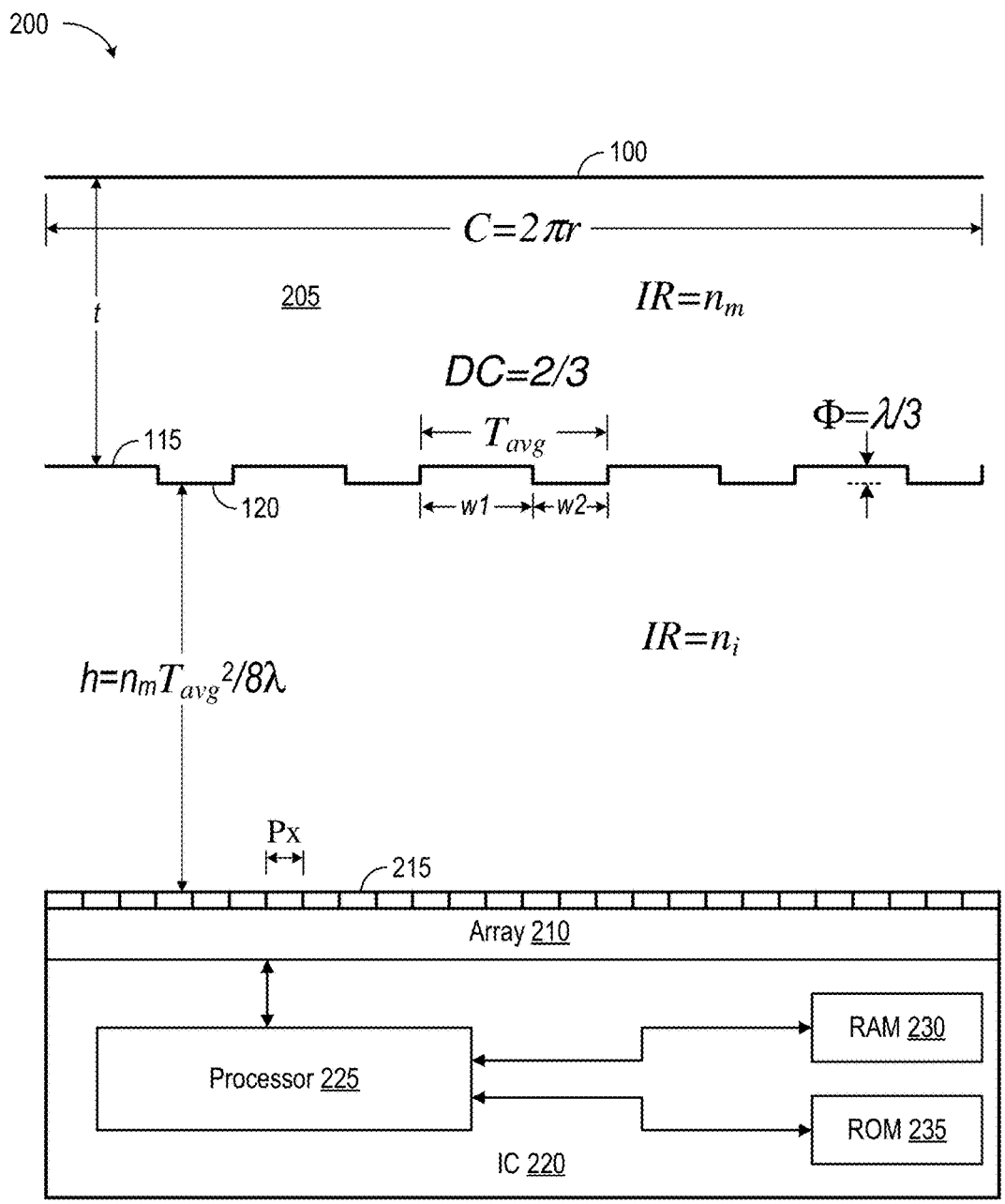
FIG. 2 is a cut-away view depicting an infrared (IR) imaging device 200 that employs phase grating 100 of FIGS. 1A and 1B in lieu of a lens to dramatically reduce size and cost.

FIG. 2 is a cut-away view depicting an infrared (IR) imaging device 200 for which the wavelength band of interest between about 7 μm and 14 μm, a band suitable for imaging room-temperature scenes. Device 200 employs phase grating 100 of FIGS. 1A and 1B in lieu of a lens to dramatically reduce size and cost. The top portion of FIG. 2 is an elliptical section 205, like those of FIG. 1B, that extends a distance 2πr, where r is the radius of section 205. The bottom portion of FIG. 2 is a linear cross section of a two-dimensional array 210 of photosensitive elements 215 of pitch Px coupled through digital communication to an integrated-circuit (IC) device 220. Elements 215 are selected for sensitivity to the band of interest. In this IR embodiment, array 210 can be a microbolometer with a 34 micron-pitch, 80×80 pixels. Aperture 110 of grating 100 can be of a diameter of about 500 μm and centered over the microbolometer.

Grating 100 has a refractive index $n_m$ and is of thickness t of e.g. 500 μm and is separated from array 210 by an air interface of index $n_i$ and height h. Grating 100 can be of e.g. silicon, which is a relatively inexpensive material that has high IR transmission, and can be patterned using well-known semiconductor processes. Grating 100 might also be an $n_m$=1.54 high-density polyethylene (HDPE) film molded or otherwise patterned to include the requisite features. Other materials are suitable, however, and can be selected for different wavelengths or for other material or cost considerations.

Sets of adjacent horizontal portions 115 and 120 repeat along a periphery of circumference C=2πr. The recessed portions 120 induce phase advances of one-third of a wavelength λ (2π/3 radians) relative to raised portions 115. With this arrangement, adjacent portions induce respective phase delays that differ by approximately one-third of a wavelength λ within the wavelength band of interest. In this example, the band of interest is from 7 μm to 14 μm, the wavelength λ is 10 μm, and the step size is 10 μm/3, or about 3.3 μm.

The diffraction induced by grating 100 has been called the "Talbot effect," a type of near-field diffraction first observed in 1836 by Henry Fox Talbot. In response to plane waves, at a given sufficient depth, a fully modulated image of grating 100 would repeat at a regular distance away from the grating plane. This regular spacing is commonly referred to as the "Talbot length" $Z_T$, and is a function of the grating period T, the refractive index $n_i$, and the incident wavelength λ; in particular, the Talbot length $Z_T=2n_i T^2/\lambda$. Self-images with different spatial periods also appear at fractions of the Talbot length. In the example of FIG. 2, grating 100 is spaced from array 210 by a distance h that is one-sixteenth the Talbot length $Z_T$ for the period $T_{avg}$ corresponding to the elliptical section that encompasses one-half the area of grating 100 (i.e., h=$Z_T$/16, or h=$n_i T_{avg}^2/8\lambda$) about twelve hundred microns in this IR example. For this circular grating 100, the elliptical section that encompasses one-half the area of grating 100 has a radius equal to the radius of aperture 110 divided by the square root of two. The distance h can be different, e.g. between two hundred and two thousand microns, and will vary in dependence upon e.g. the grating features and the wavelength band of interest.

The function of the gratings depends upon the phase difference between light leaving a grating, and this phase depends upon the effective depth of the light through the grating. When there are multiple layers of materials having different indexes if refraction n between grating 100 and array 210, this phase difference can be determined by the above equation, but without the n, and the distance h should be the sum of each slab's thickness divided by its index of refraction n.

The diffraction pattern cast onto array 210 shifts laterally with the angle of incident light, giving device 200 angle sensitivity. Also important, the interference patterns captured by the array can be processed using relatively simple algorithms, such as Fourier-domain deconvolution, which reduces or minimizes the overall computational burden. U.S. Pat. No. 9,110,240 to Patrick R. Gill and David G. Stork, incorporated herein, describes method for capturing and resolving image data acquired using phase gratings.

Array 210 samples diffraction patterns at the direction of a processor 225, which can also support image processing. Random-access memory (RAM) 230 and read-only memory (ROM) 235, in turn, support processor 225. All the components of device 200 can be integrated into the same device or package using microfabrication techniques well known to those of skill in the art. Some or all the processing is done elsewhere in other embodiments.

Figure 3A:
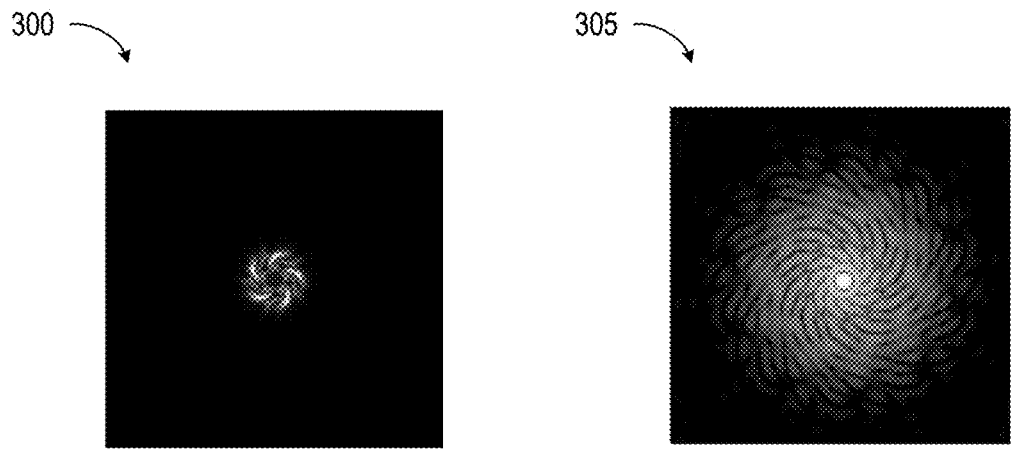
FIG. 3A depicts a simulated point-spread response (PSR) 300 for light incident grating 100 at an angle of zero degrees (i.e., from directly above grating 100 in FIG. 2), and a modulation transfer function (MTF) 305 for PSR 300.

FIG. 3A depicts a simulated point-spread response (PSR) 300 for light incident grating 100 at an angle of zero degrees (i.e., from directly above grating 100 in FIG. 2), and a modulation transfer function (MTF) 305 for PSR 300. PSR 300 is a self-image of grating 100, with a relatively bright curve for each of the five pairs of horizontal portions 115 and 120. The MTF is the absolute value of the optical transfer function (OTF), which is in turn the Fourier transform of PSR 300. The center area of MTF 305 represents DC components of PSR 300, with higher spatial frequencies representing with increasing distance from the center. MTF 305 shows that PSR 300 includes a rich set of information for a range of spatial frequencies and orientations.

Figure 3B:
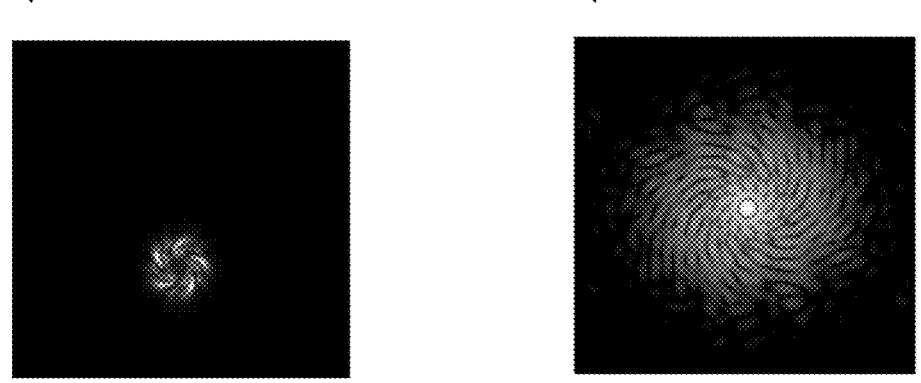
FIG. 3B depicts a simulated PSR 310 for light incident grating 100 at an angle of twenty-five degrees, and a corresponding MTF 315.

FIG. 3B depicts a simulated PSR 310 for light incident grating 100 at an angle of twenty-five degrees, and a corresponding MTF 315. PSR 310 is displaced to a degree that is a function of the angular displacement, so PSR 310 can be used to calculate the incident angle. MTF 315 is distorted due to the displacement of PSR 310, but retains sufficient information to recover useful image data.

Figure 3C:
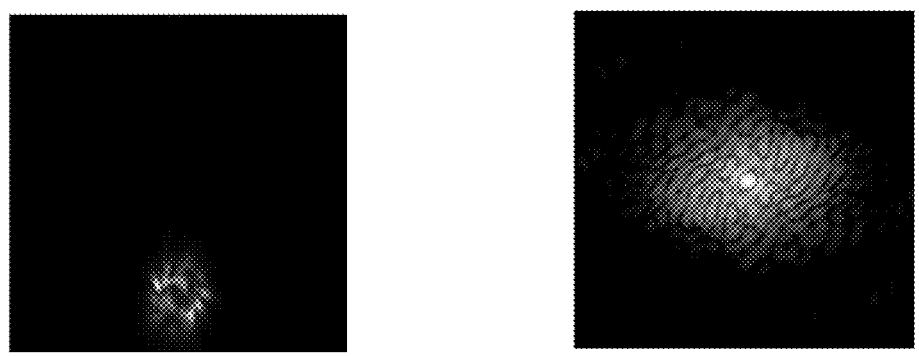
FIG. 3C depicts a simulated PSR 320 for light incident grating 100 at an angle of fifty degrees, and a corresponding MTF 325.

FIG. 3C depicts a simulated PSR 320 for light incident grating 100 at an angle of fifty degrees, and a corresponding MTF 325. PSR 320 is displaced still more than PSR 310 of FIG. 3B, with this greater displacement being a function of the increased angle of incidence. MTF 315 is considerably more distorted than those of FIGS. 3A and 3B, but retains useful spatial-frequency, amplitude, and orientation information from which to extract useful characteristics of an imaged scene.

Figure 4A:
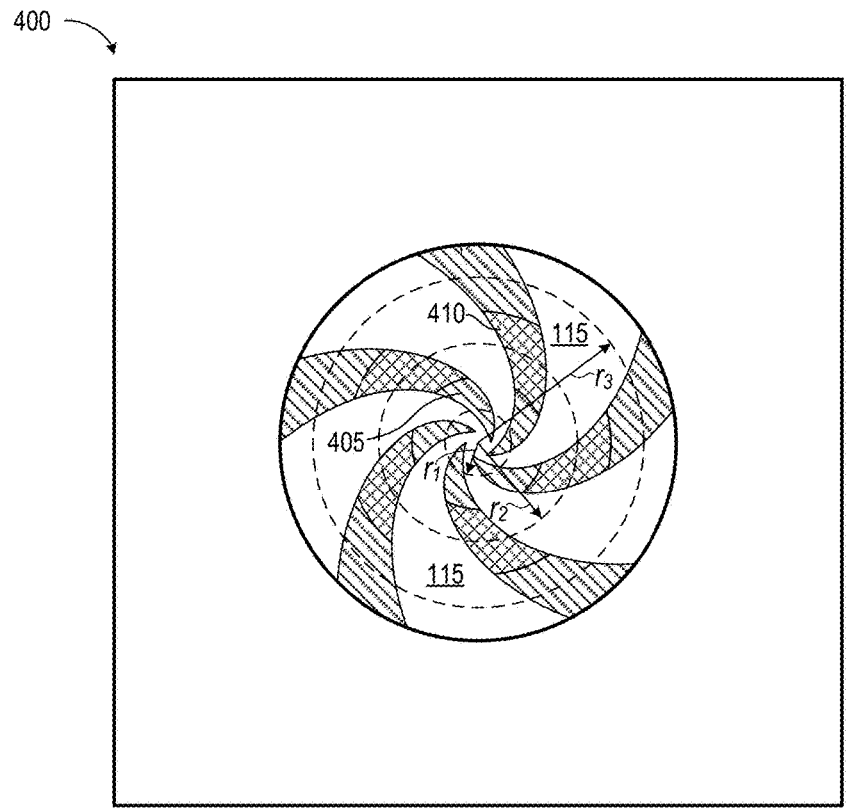

FIG. 4A is a plan view of a phase grating 400 similar to phase grating 100 of FIG. 1A, with like-identified elements being the same or similar. As in that prior example, an opaque layer 105 defines an aperture 110 to admit light, and the grating structure includes raised, radiating first horizontal portions 115. Rather than second horizontal portion of a fixed offset, however, grating 400 includes second horizontal portions that are segmented into areas 405, 410, and 415 of different step heights. These step heights tune the different regions to different wavelengths $\lambda_1$, $\lambda_2$, and $\lambda_3$ so that the overall grating 400 modulates light at an underlying plane (not shown) over a broad gamut of wavelengths.

Step-size variations can increase the useful bandwidth of imaging devices using gratings of type detailed herein. In the example of FIG. 2, the step size is selected to provide full modulation at detector array 210 for a band encompassing a wavelength $\lambda = n_r T^2/8$ h. When the band of interest is broad, as may be the case for infrared detectors, a given step size may not sufficiently modulate some wavelengths within the band. In such cases different portions of the grating can use different step sizes to best image different sub-bands that collectively make up the band of interest. Though not shown, filters can be included over the different areas 405, 410, and 415 to exclude incident light outside of the sub-bands of interest.

Figure 4B:
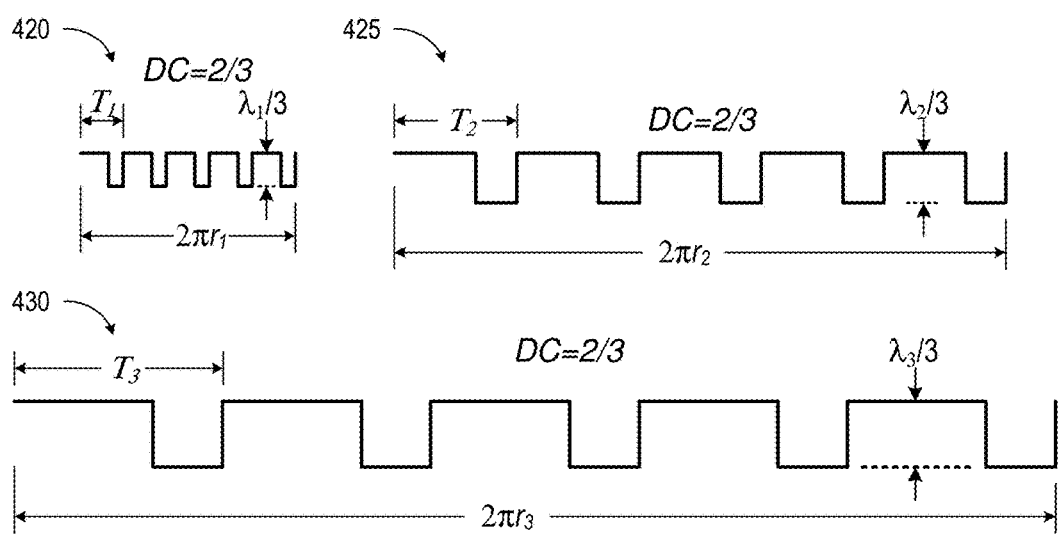
FIG. 4B depicts three unrolled elliptical sections 420, 425, and 430 that represent the topography of grating 400 along the circles defined by radii $r_1$, $r_2$, and $r_3$ of FIG. 4A.

FIG. 4B depicts three unrolled elliptical sections 420, 425, and 430 that represent the topography of grating 400 along the circles defined by radii $r_1$, $r_2$, and $r_3$ of FIG. 4A. Each elliptical section has the same two-thirds duty cycle DC, but their respective periods $T_1$, $T_2$, and $T_3$ scale with radius. Each section is also of a respective step size inducing phase shifts of $\lambda_1/3$, $\lambda_2/3$, and $\lambda_3/3$.

Figure 5A:
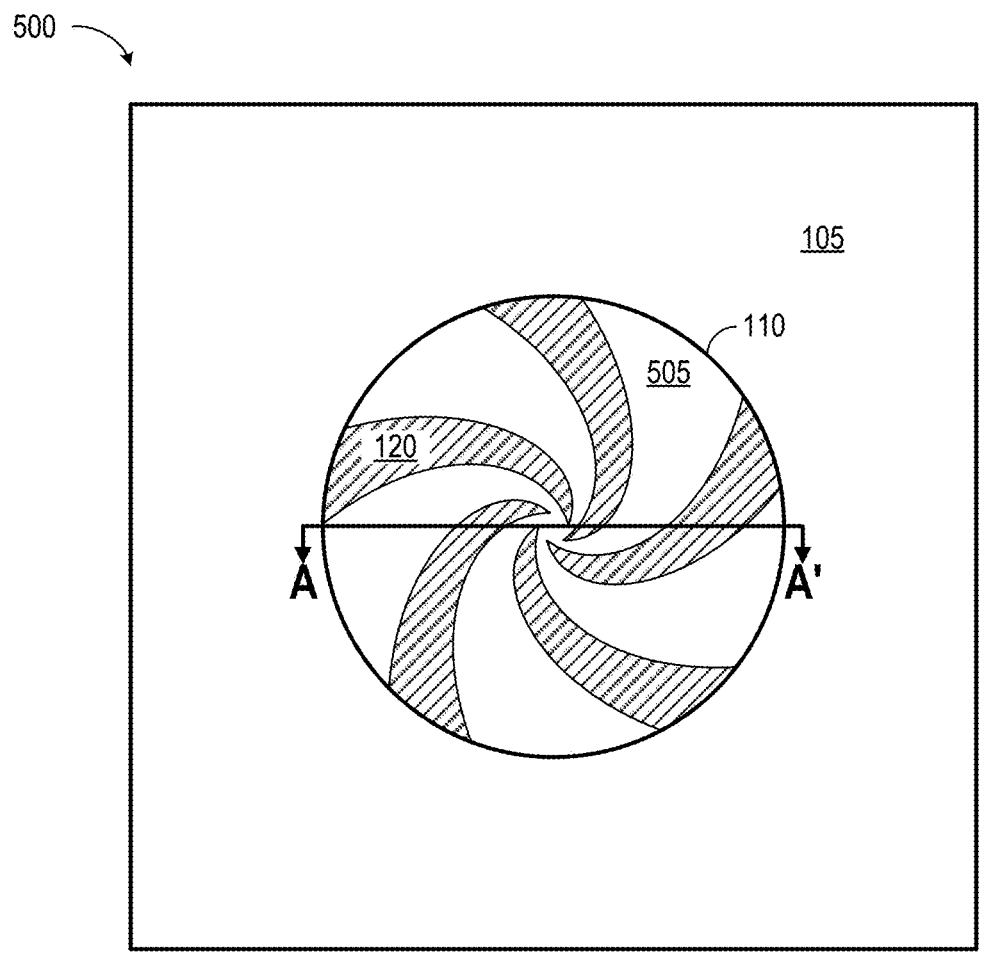

FIG. 5A is a plan view of a phase grating 500 similar to phase grating 100 of FIG. 1A, with like-identified elements being the same or similar. As in that prior example, an opaque layer 105 defines an aperture 110 to admit light, and the grating structure includes raised, radiating second horizontal portions 115. Rather than first horizontal portion of a fixed offset, however, grating 500 includes first horizontal portions 505 that slope upward from a center region 510 to produce a continuous range of steps sizes. The overall grating 500 thus modulates light over a broad gamut of wavelengths.

Figure 5B:
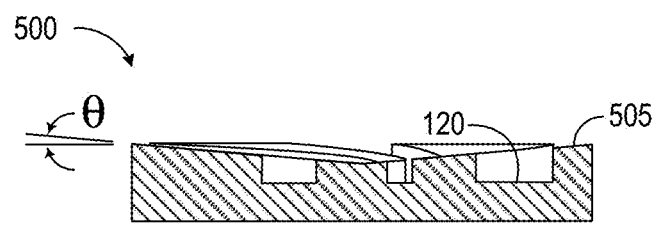
FIG. 5B depicts grating 500 of FIG. 5A, sans aperture layer 105, taken along line A-A' of FIG. 5A.

FIG. 5B depicts grating 500 of FIG. 5A, sans aperture layer 105, taken along line A-A' of FIG. 5A. This perspective shows that first horizontal portions 505 slope upward, away from the center, by an angle θ.

Figure 6:
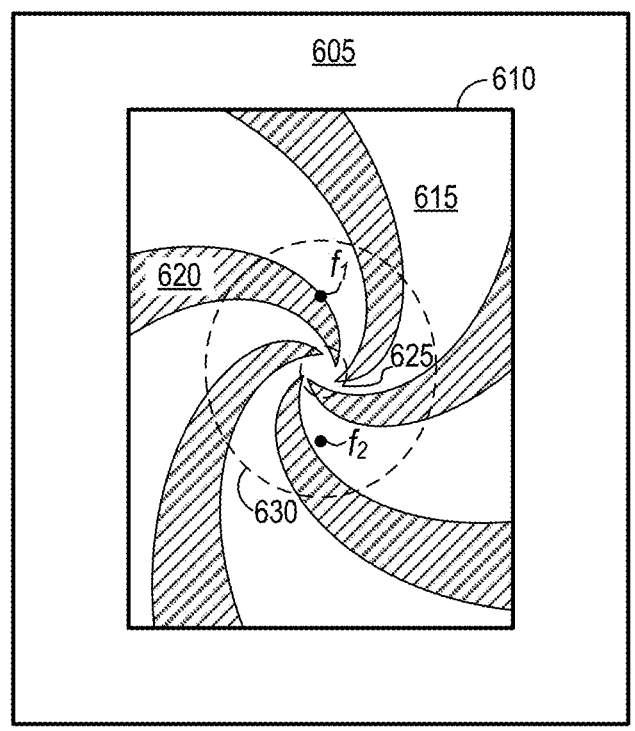
FIG. 6 depicts a grating 600 in accordance with an embodiment in which an opaque layer 605 defines a rectangular aperture 610 that encompasses horizontal portions 615 and 620 that radiate outward from a central region 625.

FIG. 6 depicts a grating 600 in accordance with an embodiment in which an opaque layer 605 defines a rectangular aperture 610 that encompasses horizontal portions 615 and 620 that radiate outward from a central region 625. The portions may extend all the way to the center, as in the example of FIG. 1A. The resultant tiny feature spacings may provide some extra optical power concentration for certain wavelengths. Portions 615 and 620 are stretched in the vertical dimension relative to the horizontal such that an elliptical section 630 defined by a pair of foci $f_1$ and $f_2$ exhibits a fifty-percent duty cycle. Other aperture and grating shapes can also be used.

A 1997 paper to Thomas J. Suleski describes thirty-six one-dimensional phase gratings that yield fully modulated irradiance distributions (see Thomas J. Suleski, "Generation of Lohmann images from binary-phase Talbot array illuminators," Applied Optics, Vol. 36, No. 20, 10 Jul. 1997, which is incorporated herein by reference). Suleski refers to these distributions as "Lohmann images" and the subset of binary gratings that create them as "Talbot array illuminators," or TIAs. With reference to the dimensions of section 150 of FIG. 1A, these TIAs have duty cycles w1/T of one half, one third, two thirds, one fourth, and three fourths with corresponding step heights Φ listed in the following Table 1.

TABLE 1

Binary-Phase Grating Parameters for Obtaining Lohmann Images

| w1/T | Φ |
|---|---|
| 1/2 | π/2, 3π/2, π |
| 1/3 | 2π/3, 4π/3 |
| 2/3 | 2π/3, 4π/3 |
| 1/4 | π |
| 3/4 | π |

Suleski describes the gratings of Table 1 as one-dimensional. Phase gratings in accordance with the present disclosure exhibit elliptical sections with parameters of these one-dimensional gratings. For example, the unrolled elliptical sections 150 and 155 of grating 100 of FIGS. 1A and 1B have the dimensions of the examples in the third row of Table 1 (w/T=⅔ and Φ-2π/3). Others of the listed one-dimensional Lohmann gratings can likewise inspire other two-dimensional gratings, with the grating separation and dimensions selected to provide full modulation for a wavelength band of interest. The grating separation h for the two-dimensional gratings can be selected to maximize light concentration over the band of interest, such as to produce the PSR that significantly illuminates the fewest pixels.

Figure 7:
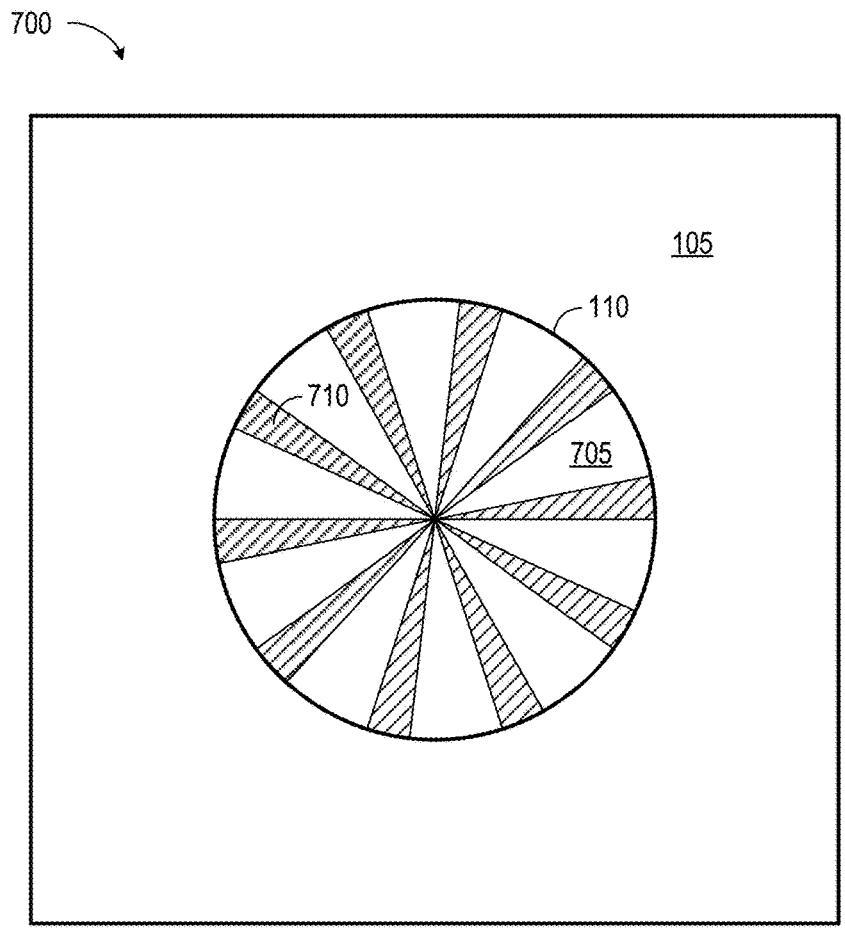
FIG. 7 is a plan view of a phase grating 700 similar to grating 100 of FIG. 1A, but in which the radiating horizontal portions 705 and 710 are straight.

FIG. 7 is a plan view of a phase grating 700 similar to grating 100 of FIG. 1A, but in which the radiating horizontal portions 705 and 710 are straight. The step size and duty cycle along an elliptical section may be the same as for grating 100. Grating 700 has a discrete number of spatial orientations, and thus provides less spatial information for recovering images and other image data than does grating 100.

Figure 8:
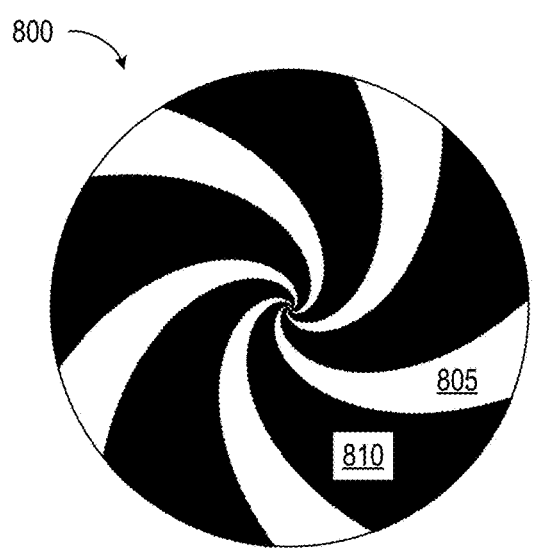
FIG. 8 depicts a phase grating 800 in accordance with an embodiment in which radiating horizontal portions 805 and 810 have a duty cycle of one-third along an elliptical section.

FIG. 8 depicts a phase grating 800 in accordance with an embodiment in which radiating horizontal portions 805 and 810 have a duty cycle of one-third along an elliptical section. That is, the raised horizontal portions 805 are half as wide as the recessed horizontal portions 810. The step size or sizes may also differ from those of previous embodiments.

Figure 9:
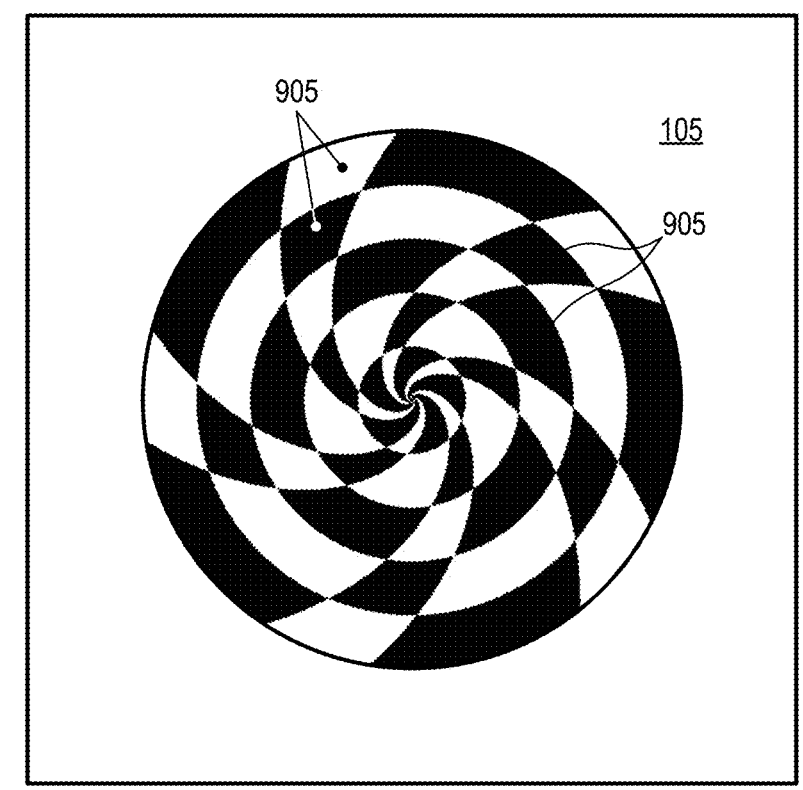
FIG. 9 is a plan view of a phase grating 900 in accordance with another embodiment.

FIG. 9 is a plan view of a phase grating 900 in accordance with another embodiment. As compared with grating 100 of FIG. 1A, elliptical steps 905 divide the radiating horizontal portions into sub-portions 910 that represent phase reversals. Phase-reversing steps 905 are roughly orthogonal to the steps separating the radiating horizontal portions, and serve to perturb otherwise smooth, relatively linear features in the PSF. The added perturbations can be beneficial because they produce more distinctive collections of illuminated pixels, and thus preserve full Fourier information of an imaged scene. Elliptical sections between steps 905 alternate between ⅓ and ⅔ duty cycles. A different spacing or spacings can be provided between steps 905.

While the subject matter has been described in connection with specific embodiments, other embodiments are also envisioned. For example, the wavelength band of interest can be broader or narrower than those mentioned here, and can be discontinuous. Other variations will be evident to those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

The invention claimed is:

1. A device to image light from a scene, the device comprising:
   a phase grating to diffract the light, the phase grating including:
   repeated sets of adjacent first and second horizontal portions filling an area of the phase grating and radiating outward from a central region of the phase grating;
   wherein the first horizontal portions are perpendicularly offset with respect to the second horizontal portions; and
   wherein, at a given distance from the central region and within the area of the phase grating, each of the first horizontal portions is of a first width that differs from a second width of the adjacent second horizontal portions; and a sensor to receive the diffracted light from the phase grating.

2. The device of claim 1, wherein the first horizontal portions are curved.

3. The device of claim 1, wherein first widths of each of the first horizontal portions are equal at the given distance from the central region.

4. The device of claim 1, wherein the first and second horizontal portions extend from a common point within the central region.

5. The device of claim 1, wherein the sensor includes rows and columns of photosensitive elements.

6. The device of claim 1, wherein the light includes light of wavelength $\lambda$, wherein the horizontal portions of an elliptical section of the phase grating have a period T and are spaced from the sensor by a separation of thickness h and refractive index n, wherein the thickness h is less than $2nT^2/\lambda$.

7. The device of claim 6, wherein the thickness h is $nT^2/8\lambda$.

8. The device of claim 6, wherein the elliptical section has a period T and a periphery P=T(2n−1), where n is an integer.

9. A phase grating comprising:
repeated sets of adjacent first and second horizontal portions filling an area of the phase grating and radiating outward from a central region of the phase grating;
wherein the first horizontal portions are perpendicularly offset with respect to the second horizontal portions; and
wherein, at a given distance from the central region and within the area of the phase grating, each of the first horizontal portions is of a first width that differs from a second width of the adjacent second horizontal portions.

10. The phase grating of claim 9, wherein the horizontal portions are curved.

11. The phase grating of claim 9, wherein the first widths of each of the first horizontal portions are equal at the given distance from the central region.

12. The phase grating of claim 9, wherein the first and second horizontal portions number 2n−1, where n is an integer.

13. The phase grating of claim 9, wherein the first horizontal portions are offset with respect to the second horizontal portions at the given distance from the central region by a step resulting in an optical path length difference of between two and twelve microns.

14. The phase grating claim 9, wherein the area is elliptical.

* * * * *